United States Patent [19]

Houston

[11] Patent Number: 5,703,517

[45] Date of Patent: Dec. 30, 1997

[54] POWER REDUCTION IN A TEMPERATURE COMPENSATING TRANSISTOR CIRCUIT

[75] Inventor: Theodore W. Houston, Richardson, Tex.

[73] Assignee: Texas Instruments Incorporated, Dallas, Tex.

[21] Appl. No.: 615,576

[22] Filed: Mar. 12, 1996

Related U.S. Application Data

[63] Continuation of Ser. No. 66,698, May 25, 1993, abandoned.

[51] Int. Cl.[6] .................. H01L 35/00; G06G 7/12
[52] U.S. Cl. .................. 327/312; 327/170; 327/362; 327/512
[58] Field of Search ................ 307/491, 542, 307/546–8, 263, 310

[56] References Cited

U.S. PATENT DOCUMENTS

| | | | |
|---|---|---|---|
| 5,051,615 | 9/1991 | Rosenthal | 327/512 |
| 5,099,381 | 3/1992 | Wilcox | 327/512 |
| 5,128,823 | 7/1992 | Fujimoto et al. | 327/509 |
| 5,144,405 | 9/1992 | Naber | 307/542 |
| 5,291,071 | 3/1994 | Allen et al. | 307/310 |
| 5,311,070 | 5/1994 | Dooley | 327/512 |
| 5,321,326 | 6/1994 | Shigehara et al. | 307/542 |

*Primary Examiner*—Margaret Rose Wambach
*Attorney, Agent, or Firm*—Jacqueline J. Garner; W. James Brady, III; Richard L. Donaldson

[57] ABSTRACT

A circuit for providing parameter compensation to a drive transistor of logic circuit A. A regulating transistor circuit B is connected in series with the drive transistor in order to limit the current in the drive transistor. Bias circuitry C is also provided for supplying a bias voltage Vb to a gate of the regulating transistor circuit B, wherein the voltage is responsive to a predetermined parameter. The bias circuitry C comprises an element which is sensitive to the predetermined parameter.

29 Claims, 6 Drawing Sheets

POWER REDUCTION IN A TEMPERATURE COMPENSATING TRANSISTOR CIRCUIT

This application is a Continuation of application Ser. No. 08/066,698, filed May 25, 1993, now abandoned.

FIELD OF THE INVENTION

The invention relates generally to semiconductor devices and more specifically to current regulating transistor circuits.

BACKGROUND

The variation of drive current in transistor circuits due to various parameters such as temperature, gate length or threshold voltage sometimes leads to undesirable compromise in circuit performance. U.S. patent application Ser. No. 837,200, filed Feb. 14, 1992, now abandoned and assigned to Texas Instruments, Inc. addresses the temperature compensation generally needed in a circuit involving transistors. Metal oxide semiconductor ("MOS") circuits and complementary metal oxide semiconductor ("CMOS") circuits have operating characteristics which are strongly dependent upon parameters such as gate length, threshold voltage, or temperature. In particular, the conductance of MOS or of a CMOS field effect transistor ("FET") decreases with increasing temperature. As a result of this variation, circuit performance must sometimes be reduced to keep a circuit functional over a reasonable temperature range. FET performance is generally reduced so that the transistor will not over-conduct in the low temperature domain. This compromise results in a less capable circuit given a particular level of technology. In most instances, a circuit designed to operate over a wide temperature range simply does not switch as fast as a circuit designed to operate over a narrow temperature range.

Over-conductance in FET circuits causes a momentarily high rate of current change per unit time through the FET when the FET turns on. This change, when coupled with the inherent inductance of a circuit, causes an induced electromotive force ("EMF") which opposes the flow of current. This induced EMF will create a noise in the voltage supply and ground plane. This in turn may cause various errors known in the art such as dock cycle failure. A circuit designed not to cause such errors at low temperature may be slower than would otherwise be necessary at high temperature.

It is sometimes desired to introduce a delay in a circuit of a magnitude equal or greater than some given delay, for example to allow for a specified amount of skew in input signals. A circuit with delay design to meet that requirement at low temperature may be slower than otherwise necessary at high temperature. Therefore, a need has arisen for a circuit for MOS and CMOS applications which is able to compensate for parameter induced conductance variation.

SUMMARY

A circuit for providing parameter compensation to a drive transistor is disclosed. A regulating transistor is connected in series with the drive transistor in order to limit the current in the drive transistor. Control circuitry is also provided for supplying a bias voltage to a gate of the regulating transistor, wherein the voltage is responsive to a predetermined parameter. The control circuitry comprises an element which is sensitive to the predetermined parameter.

For example, the temperature dependance of the response of a circuit can be compensated by placing a regulating transistor in series with a drive transistor in the circuit such that the regulating transistor limits the current that can flow through the drive transistor. The temperature compensation is then obtained by regulating the voltage on the gate of said regulating transistor such that higher current is allowed at high temperature than at low temperature. This voltage regulation can be accomplished by use of elements with temperature sensitive conductivity, such as diodes or polysilicon resistors. The current through these temperature sensitive elements in the control circuitry can be controlled to save power when the circuit is not active.

An advantage of the invention is providing current-varying parameter compensation to a logic circuit.

A further advantage of the invention is providing a compensation circuit requiring reduced power consumption.

These and other advantages will be apparent to those skilled in the art having reference to this specification in conjunction with the drawings.

BRIEF DISCUSSION OF DRAWINGS

DETAILED DESCRIPTION OF THE INVENTION

The invention is described in conjunction with a CMOS circuit having temperature compensation. It will be apparent to those skilled in the art that other circuits such as MOS and BiCMOS circuits may also realize the benefits of the invention. It will also be apparent to those skilled in the art that any parameter which can induce current variation, such as gate length or threshold voltage, may instead be compensated for while realizing the benefits of the invention.

Figure 1:
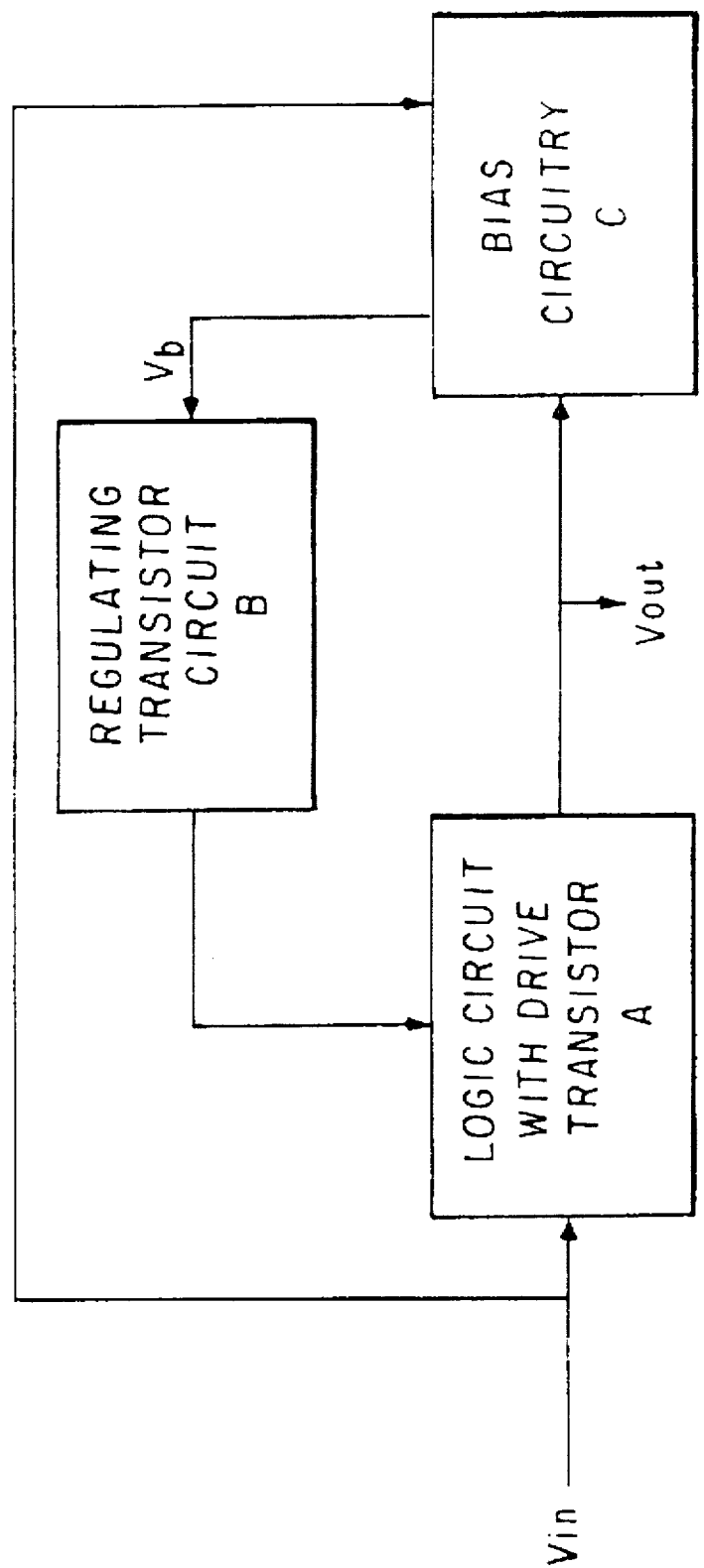
FIG. 1 is a block diagram of a first preferred embodiment of the invention.

FIG. 1 shows a block diagram of the first preferred embodiment of the invention. The circuit is divided into three functional blocks. The first block contains a logic circuit A having a drive transistor for which the parameter compensation is desired. Logic circuit A may comprise, for example an inverter, a NAND, or a NOR circuit. The preferred embodiments of the invention will be described in conjunction with an inverter. The second block contains the regulating transistor circuit B which limits the current through the drive transistor of the logic circuit A. The third block contains a bias circuit C which provides the bias voltage Vb to the regulating transistor circuit B. The bias voltage Vb provided by bias circuitry C is dependant upon a predetermined current varying parameter such as temperature, gate length or threshold voltage. The degree to which regulating transistor circuit B limits the current through the drive transistor in logic circuit A is in turn, determined by the bias voltage, Vb, supplied by bias circuitry C. Three examples of bias circuitry C will be discussed below. However, other alternatives will be apparent to those skilled in the art. The detailed circuitry and operation for these functional blocks are discussed below.

Figure 2A:
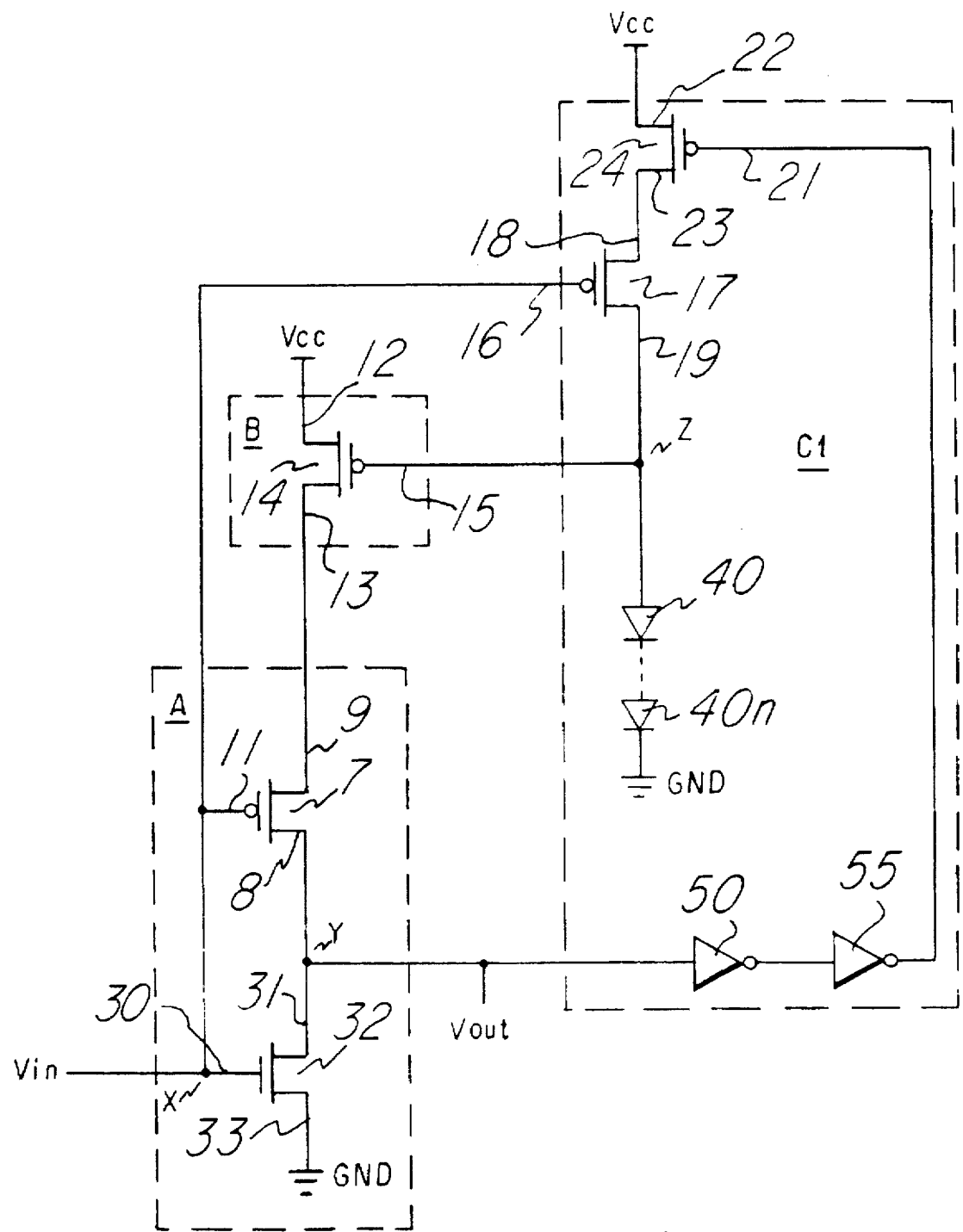
FIG. 2a is a schematic diagram of a first preferred embodiment of the invention applied to compensate the temperature dependence of the rise time of a selected circuit node.

FIG. 2a illustrates a first preferred embodiment for circuitry to provide temperature compensation for the current and voltage rise time on node y. Logic circuit A is shown in FIG. 2a as an inverter having a p-channel transistor 7 and a n-channel transistor 32. As discussed above, other logic circuits may alternatively be used. Regulating transistor circuit B comprises a p-channel transistor 14. Drain 8 of transistor 7 is connected to the drain 31 of transistor 32. The gate 11 of transistor 7 is connected to Vin. The source 9 of transistor 7 is connected to the drain 13 of transistor 14. The source 33 of transistor 32 is connected to ground. The gate 30 of transistor 32 is connected to Vin. Source 12 of transistor 14 is connected to Vcc. Gate 15 of transistor 14 is connected to node z. Bias circuitry C uses node y as an input to two inverters 50 and 55 connected in series between node y and the gate 21 of transistor 24. Node y is defined as the intersection of drain 8 of transistor 7, the drain 31 of transistor 32 and the input of inverter 50. The source 22 of transistor 24 is connected to Vcc and the drain 23 is connected to the source 18 of transistor 17. The gate 16 of p-channel transistor 17 is connected to Vin and the drain 19 of transistor of transistor 17 is connected to node z. Node z is defined as the intersection of gate 15 of transistor 14, drain 19 of transistor 17, and the input to element 40. Node z is connected to circuit element 40 which is sensitive to the predetermined current varying parameter (e.g., temperature). FIG. 2a depicts elements 40–40N as a series of diodes between node z and ground. Alternately, a polysilicon resistor may be used. Other alternatives include diffusion resistors or transistors. The parameter sensitivity of the voltage on node z can also be caused by the parameter sensitivity of transistor 17 and/or 24, with element 40 not being sensitive to the parameter. Other alternatives will be apparent to those skilled in the art. Below, the static conditions are discussed for both Vin high and Vin low. Following that, the dynamic response for a transition of Vin from high to low is discussed.

TABLE I

STATIC CONDITIONS OF TRANSISTORS IN FIG. 2a

| TRANSISTORS | VIN (STATIC) | |
|---|---|---|
| | HIGH | LOW |
| 7 | OFF | ON |
| 14 | ON | ON |
| 17 | OFF | ON |
| 24 | ON | OFF |
| 32 | ON | OFF |

Table I shows two conditions: Vin at a static low or a static high. One can see the static conditions for all transistors in the circuit shown in FIG. 2a for both high and low static conditions of Vin. In the high condition at Vin, transistor 7 will be off due its gate 11 being in a high state. Transistor 14 is on because of its gate 15 being low. Transistor 17 is off because of its gate 16 being high. Transistor 24 is on because its gate 22 is low. Transistor 32 is on because of its gate 30 being high. In the low condition, when Vin is low, transistor 7 is on because its gate 11 is high. Transistor 14 is on because of its gate 15 being low. Transistor 24 is off because of its gate 21 being high. Transistor 32 is off because of its gate 30 being low. Thus for either static condition (Vin high or low) there is no static current flow.

The embodiment illustrated in FIG. 2a is designed to compensate for the effect of temperature variation of the conductivity of transistor 7 on the rise time of node y when Vin transitions from high to low. Other parameter variations, such as gate length or threshold voltage may of course also be compensated for. When Vin transitions from high to low, transistors 7 and 17 are turned on and transistor 32 is turned off. Transistor 14 will be initially on (gate 15 at ground potential), and thus current will flow through transistors 14 and 7 from the supply to node y. Current will also flow from Vcc through transistors 24 and 17 to raise the voltage of node z. The voltage to which node z rises will depend on the conductivity of the diodes, 40 through 40N, which are temperature sensitive. At lower temperatures, the voltage of node z will rise higher relative to that at higher temperatures. The number of diodes and the relative sizes of the diodes and transistors can be adjusted so that the current flowing through transistor 14 in series with transistor 7 to node y is relatively independent of temperature. It is also possible to select the number of diodes and relative sizes of transistors and diodes such that the flow of current will be greater at high temperature than at low temperature, or vice-versa. Methods for adjusting the relative sizes of the diodes and transistors to achieve the above conditions are well known in the art and will be obvious to those skilled in the art. It will also be obvious to those skilled in the state of the art that other temperature insensitive elements could be used such that the temperature sensitivity of the voltage on node z would be determined by the temperature sensitivity of transistor(s) 17 and/or 24. Further, elements could be chosen to cause the voltage on node z to be dependent on variations in gate length, moat width or threshold voltages, for example. After node y transitions to a high logic level, and this transition is propagated through inverters 50 and 55, transistor 24 will be turned off, eliminating static current in the voltage regulating part of the circuit.

For the operation described above to be effective, it is necessary that the node z transition from ground potential to the intermediate potential determined by the conductivity of the diodes be fast relative to the rise time of node y. This condition is easily met if the transition of node y is relatively slow, as in a delay circuit or in an output buffer drive circuit. If the rise time of the circuit node to be temperature compensated is relatively fast, then the temperature regulated voltage on gate 15 of transistor 14 must be applied before or simultaneously with the transition of Vin. A circuit for accomplishing will be described below with the reference to FIG. 5.

Figure 2B:
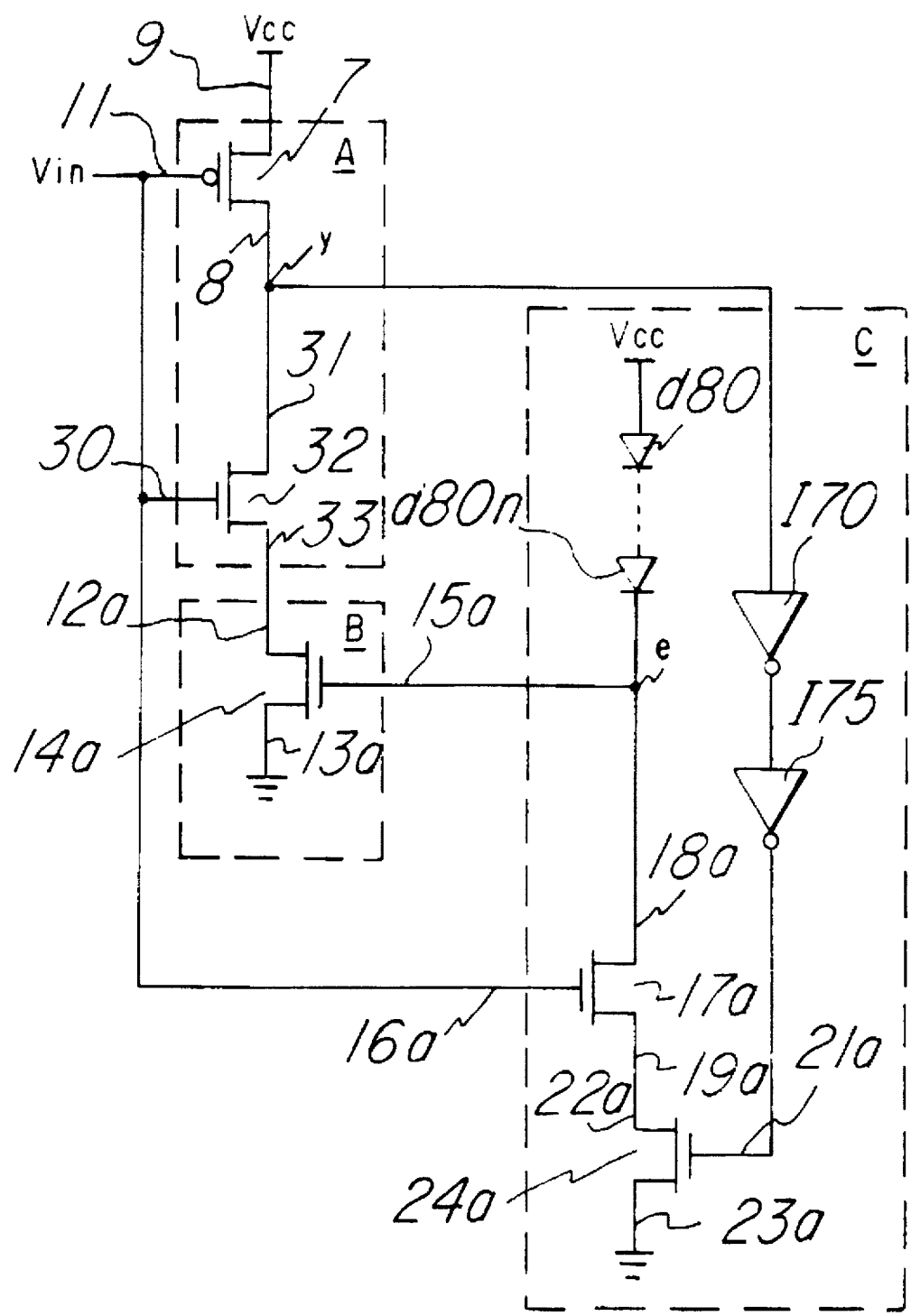
FIG. 2b is a schematic diagram of a first preferred embodiment of the invention applied to compensate the temperature dependence of the fall time of a selected circuit node.

FIG. 2b illustrates a first preferred embodiment for circuitry to provide for temperature compensation for the current and voltage fall time on node y. The node y is defined as the intersection of the gate 15a of transistor 14a, the drain 18a of transistor 17a, and the output of d80n. Logic circuit A is the same inverter having a p-channel transistor 7 and a n-channel transistor 32. As was shown in FIG. 2a as discussed above, other logic circuits may be alternatively be used. Regulating transistor circuit B comprises an n-channel transistor 14a. The drain 12a of transistor 14a is connected to the source 33 of transistor 32. The source 13a of transistor 14a is connected to ground, and the gate 15a of transistor 14a is connected to node e. The node e is defined as the intersection of gate 15a of transistor 14a, the drain 18a of transistor 17a, and the output of d80n element 40. The gate 30 of transistor 32 is connected to Vin, and its drain 31 is connected node y and the drain 8 of transistor 7. The gate 11 of transistor 7 is connected to Vin. The source 9 of transistor 7 is connected to Vcc. Node y is connected to two inverters 170 and 175 in series between node y and gate 21a of transistor 24a. The source 23a of transistor 24a is connected to ground. The drain 22a of transistor 24a is connected to the source 19a of transistor 17a. The gate 16a of transistor 17a is connected to Vin. The drain 18a of transistor 17a is connected to the gate 15a of transistor 14a. The gate 16a of transistor 17a is connected to Vin. A series of diodes d80 through d80n are connected between Vcc and node e.

TABLE II

STATIC CONDITIONS OF TRANSISTORS IN FIG. 2B

| TRANSISTORS | VIN (STATIC) | |
| --- | --- | --- |
| | HIGH | LOW |
| 7 | OFF | ON |
| 14a | ON | ON |
| 17a | ON | OFF |
| 24a | OFF | ON |
| 32 | ON | OFF |

Table II shows two conditions: Vin at a static high level or at a static low level. One can see the static conditions for all transistors in the circuit 2b for both high and low static conditions of Vin. In the high condition at Vin, transistor 7 will be off because of its gate 11 being at a high. Transistor 17a will be on because gate 16a being high. Transistors 32 and 14a will also be on because of their gates 30 and 15a respectively being high. Transistor 24a is off because its gate 21a being low. In the condition when Vin is at a static low, transistor 7 will be on because of its gate 11 being low. Transistor 32 will be off because of a low level at its gate 30. Transistor 24a will be on because of its gate 21a being at a high level. Transistor 17a will be off because of its gate 16a being low. Transistor 14a will be on because its gate 15a being high.

The embodiment illustrated in FIG. 2b is designed to compensate for the effect of temperature variation of the conductivity of transistor 32 on the fall time of node y when Vin transitions from a low to high. When Vin transitions from low to high, transistor 32 and 17a turn on and transistor 7 is turned off. Transistor 14a will initially be turned on, and thus current will flow through transistor 32, 14a, 17a, and 24a to lower the voltage on node e. The voltage to which node e falls will depend upon the conductivity of the diodes 40a through 40aN which are temperature sensitive. At lower temperatures the voltage at node e will be lower relative to that at higher temperature. The number of diodes and relative sizes of diodes and transistors can be adjusted so that the current flowing through transistor 32 to node y is relatively independent of temperature. It is also possible to select the number of diodes and relative sizes of transistors such that the flow of current will be greater at high temperatures, or vice versa. After node y transitions to a low level, and this transitions is propagated through inverters 50 and 55a, transistor 24a will be turned off eliminating static current in the voltage regulating part of the circuit.

Figure 3:
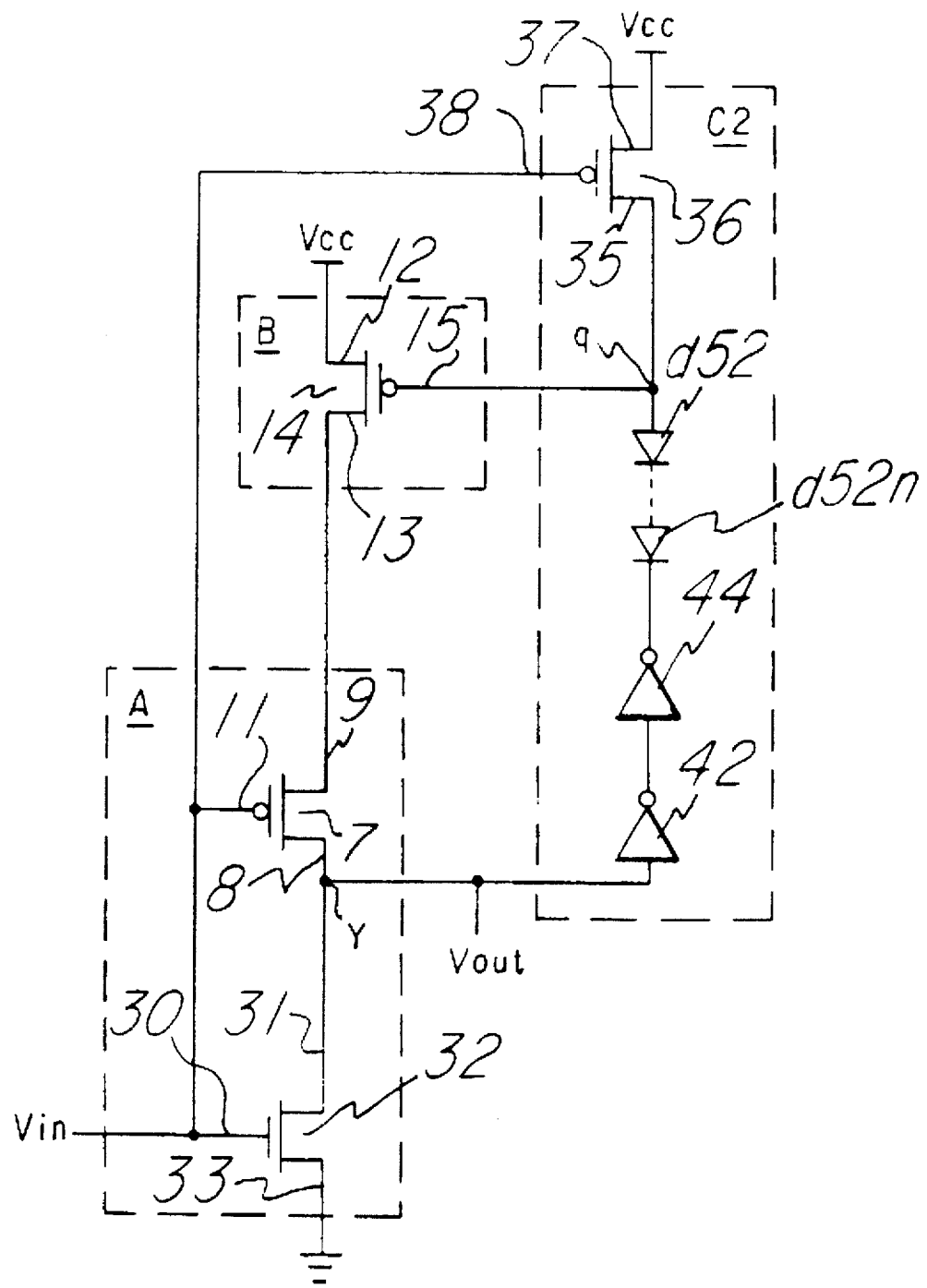
FIG. 3 is a schematic diagram of an alternative first preferred embodiment of the invention.

FIG. 3 shows an alternative of the temperature regulating circuit for rise time on node y (Vout). Node y is defined as the intersection of drain 8 of transistor 7, the drain 31 of transistor 32, and the input to inverter 42. The circuitry for the logic circuit A with drive transistor, and the regulating transistor B are identical to those in the first preferred embodiment discussed above, however the bias circuitry will be different to the extent discussed below and shown in FIG. 3. Logic circuit A is shown in FIG. 3 as an inverter having a p-channel transistor 7 and an n-channel transistor 32. As discussed above, other logic circuits may alternately be used. Regulating transistor circuit B comprises a p-channel transistor 14. Source 12 of transistor 14 is connected to Vcc. Drain 13 of transistor 14 is connected to source 9 of transistor 7. Gate 15 of transistor 14 is connected to node q. Node q is defined as the intersection of the drain 35 of transistor 36, the gate 15 of transistor 14, and the input to diode d52. Bias circuitry C uses Vout as an input to two inverters 42 and 44 in series between Vout and the output of diode 52n. A series of diodes d52–d52N are connected between node q and the output of inverter 44. The source 37 of transistor 36 is connected to Vcc. The gate 38 of transistor 36 is connected to Vin. When Vin goes from a high to low, current will flow from the Vcc supply through transistor 36 to raise the voltage of node q. The voltage to which node q goes will depend on the conductivity of the diodes d52 through d52N which are temperature sensitive. At lower temperatures, the voltage of node q will rise higher relative to that at higher temperatures. As above, the number of diodes and relative sizes of the diodes and transistors can be adjusted so the sum current flowing to node y through transistor 14 is relatively independent of temperature, or alternatively, such that the flow of current will be greater at high temperature than at low temperature, or vice versa.

It should be noted that the preferred embodiments are intended to allow for any temperature sensitive element in place of the diode(s), and other circuitry that provide temperature responses that affect the voltage on gate 15 of transistor 14. Also, it is intended to allow for other parameters e.g. Vt and gate length to affect the voltage on gate 15 of transistor 14. It is also intended that the regulating transistor 14 can be on the drain side of the transistor with which it is in series. It is further intended that the invention allows for application to various logic gates, such as NAND or NOR, as well as to an inverter as described.

Figure 4:
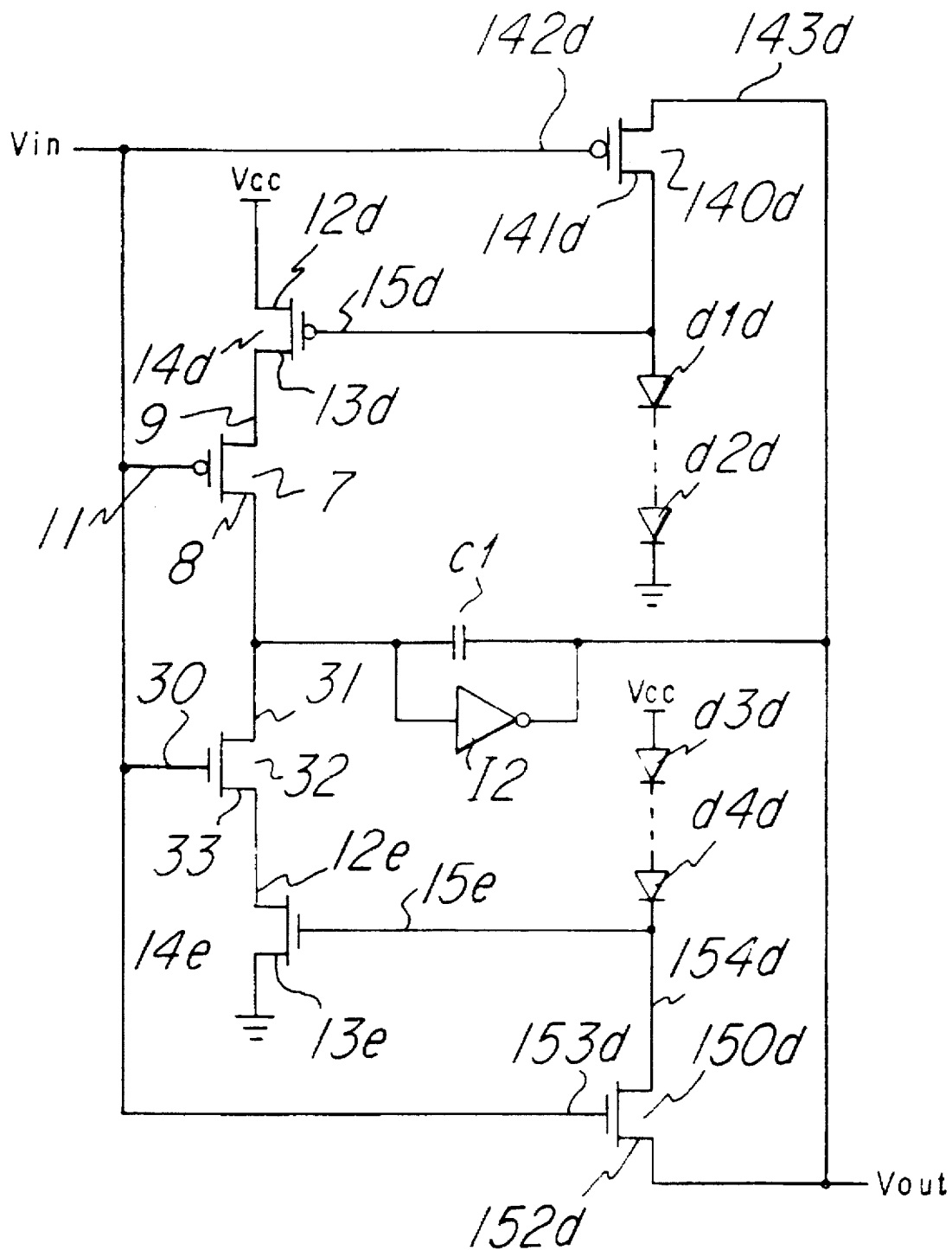
FIG. 4 is a schematic diagram of the preferred embodiment as applied to a delay circuit.

The preferred embodiments of the invention may be applied to various circuit functions. For example, FIG. 4 shows the preferred embodiments as applied to a delay circuit. FIG. 4 shows a first inverter comprising transistors 7 and 32, as in the above examples, and second inverter I2. Capacitor C1 is connected in parallel with the second inverter I2. The drain 12e of transistor 14e is connected to the source 33 of transistor 32. The source 13e of transistor 14e is connected to ground. The gate 15e is connected to the drain 154d of transistor 150d. The gate 153d of transistor 150d is connected to Vin. The source 152d of transistor 150d is connected to the output of inverter I2 and the source 143d of transistor 140d. This intersection is also Vout of FIG. 4. Vin is also connected to the gate 30 of transistor 32, the gate 11 of transistor 7, and the gate 142d of transistor 140d. The drain 31 of transistor 32 is connected to the drain 8 of transistor 7 and to the input of inverter I2. The source 9 of transistor 7 is connected to the drain 13d of transistor 14d. The source 12d of transistor 14d is connected to Vcc. The gate 15d of transistor 14d is connected to the drain 141d of transistor 140d and to the input of diode d1d. Diodes d1d and d2d are connected in series between the drain 141d of transistor 140d and ground. The diodes d3d and d4d are connected in series between Vcc and the drain 154d of transistor 150d. Thus, temperature compensation according to the invention is applied to transistors 7 and 32. The relative sizes of the transistors and diodes are adjusted such that the delay provided by the circuit in FIG. 4 is independent of temperature (or whatever parameter is being compensated for). Alternately, they can be adjusted such that the delay increases or decreases with temperature (or whatever parameter is being adjusted for).

It is believed that this invention is the first use of a current regulating transistor in series with a circuit element where the gate voltage of the regulating transistor is controlled to obtain the desired temperature (or other parameters) response.

Figure 5:
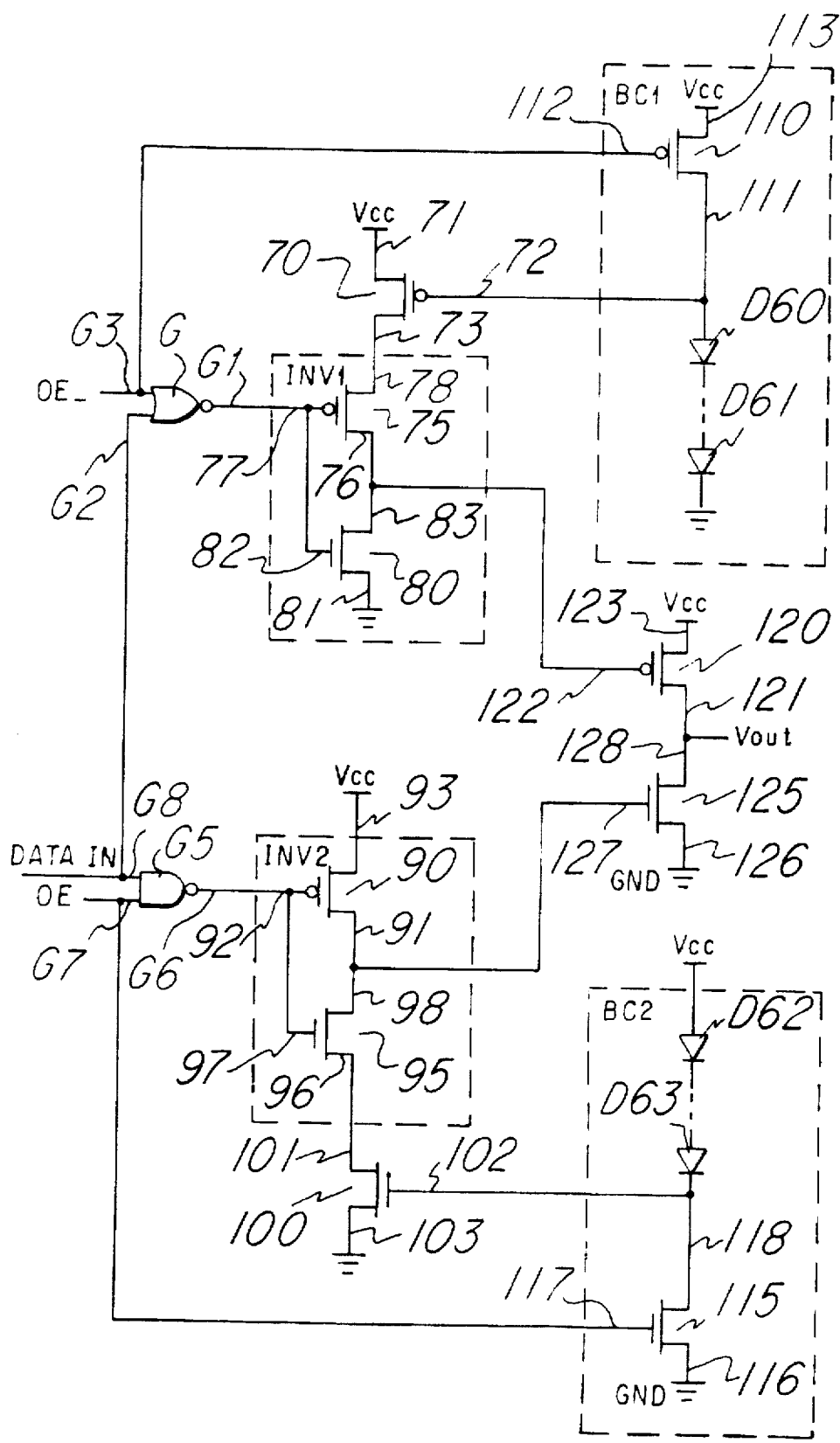
FIG. 5 is a schematic diagram of an output buffer according to a second preferred embodiment of the invention with temperature compensation for both rise and fall time.

FIG. 5 shows a second embodiment of the invention applied to an output buffer. Compensation of the current supplied to gates 122 and 128 of transistors 120 and 125 respectively will compensate for variation in the conductivity of transistors 120 and 125 respectively. The compensation provided by this circuit will occur faster than any of the circuits discussed above because inputs OE and OE_ are connected to input gates of the bias circuitry BC1 and BC2. This allows the input data to be at least one logic level ahead of the regulating circuitry as can be seen in FIG. 5.

Signals OE_ and OE are connected to inputs G3 and G7 of gates G and G5, respectively. Data In is connected to inputs G2 and G8 of gates G and G5, respectively. The output G1 of gate G is connected to gate 77 of transistor 75 and to the gate 82 of transistor 80. Transistors 75 and 80 made up inverter INV1. The source 71 of regulating transistor 70 is connected to Vcc. The source 81 of transister 80 is connected to ground. The gate 72 of regulating transistor 70 is connected to the drain 111 of transistor 110. Transistor 110 and diodes D60–D61 comprise bias circuitry BC1. The source 113 of transistor 110 is connected to Vcc. Diodes D60 and D61 are connected in series between drain 111 of transistor 110 and ground. The gate 112 of transistor 110 is connected to the input signal OE_. The output of INV1 is connected to the gate 122 of transistor 120. The source 123 of transistor 120 is connected to Vcc. The drain 121 of transistor 120 is connected to Vout.

Output G6 of gate G5 is connected to gates 92 and 97 of transistors 90 and 95 respectively. Transistors 90 and 95 make up inverter INV2. The drain 101 of regulating transistor 100 is connected to the source 96 of transistor 95. The source 93 of transistor 90 is connected to Vcc. The drain 91 of transistor 90 is connected to the drain 98 of transistor 95. The source 103 of transistor 100 is connected to ground. The gate 102 of transistor 100 is connected to the drain 118 of transistor 115. Transistor 115 and diodes D62 and D63 make up bias circuitry BC2. The source 116 of transistor 115 is connected to ground. The gate 117 of transistor 115 is connected to the signal OE. The output of inverter INV2 is connected to the gate 127 of transistor 125. The drain 128 of transistor 125 is connected to the drain 121 of transistor 120 and to Vout. The source 126 of transistor 125 is connected to ground. Diodes d62 and d63 are connected in series between Vcc and the drain 118 of transistor 115.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit including a pre-inverter input signal and an inverter having an input, an output, and a drive transistor, said circuit comprising:

a regulating transistor connected in series with said drive transistor for limiting current in said drive transistor, said regulating transistor and said drive transistor being connected in series between a supply voltage and said output node with said regulating transistor connected between said drive transistor and said supply voltage; and control circuitry connected to said pre-inverter input signal for supplying a voltage to a gate of said regulating transistor responsive to a predetermined current varying parameter, said control circuitry comprising an element sensitive to said predetermined current varying parameter.

2. A delay circuit having first and second drive transistors each connected to and for supplying current to a node, comprising:

first and second regulating transistors connected in series with said first and second drive transistors, respectively, for limiting current in said first and second drive transistors;

rise time control circuitry connected to a gate of said first regulating transistor and for supplying a first voltage to said gate of said first regulating transistor responsive to a predetermined parameter, said rise time control circuitry comprising a first element sensitive to said predetermined parameter; and fall time control circuitry connected to a gate of said second regulating transistor and for supplying a first voltage to said gate of said second regulating transistor responsive to said predetermined parameter, said fall time control circuitry comprising a second element sensitive to said predetermined parameter.

3. The delay circuit of claim 2, wherein said predetermined parameter is temperature.

4. The delay circuit of claim 2, wherein said first and second elements each comprise at least one diode.

5. The delay circuit of claim 2, wherein said first and second elements each comprise a polysilicon resistor.

6. The delay circuit of claim 2, wherein said sensitivity is reduced.

7. The delay circuit of claim 2, wherein said sensitivity is increased.

8. An integrated circuit comprising:

a control circuit comprising an element sensitive to a predetermined parameter, said control circuit having a control circuit output;

a logic gate, said logic gate comprising:
an input;
an output;
a first drive transistor connected between said output and a first supply voltage and having a gate connected to said input; and
a second drive transistor connected between said output and a second supply voltage and having a gate connected to said input; and a regulating transistor connected in series with said first drive transistor between said drive transistor and said first supply voltage and having a gate connected to said control circuit output.

9. The circuit of claim 8 wherein said predetermined parameter is temperature.

10. The circuit of claim 8 wherein said predetermined parameter is gate length.

11. The circuit of claim 8 wherein said predetermined parameter is threshold voltage.

12. The circuit of claim 8, wherein said control circuitry further comprises:

at least one transistor connected to said gate of said regulating transistor, wherein said element is connected to said gate of said regulating transistor and wherein said at least one transistor and said element are chosen such that a rise time of said output node is less sensitive to said predetermined parameter.

13. The circuit of claim 8, wherein said control circuitry further comprises:
   at least one transistor connected to said gate of said regulating transistor, wherein said element is connected to said gate of said regulating transistor and wherein said at least one transistor and said element are chosen such that a rise time of said output node is more sensitive to said predetermined parameter.

14. The circuit of claim 8, wherein said control circuitry further comprises:
   at least one transistor connected to said gate of said regulating transistor, wherein said element is connected to said gate of said regulating transistor and wherein said at least one transistor and said element are chosen to control the sensitivity of a fall time of said output node to said predetermined parameter.

15. The circuit of claim 8, wherein said element is a diode.

16. The circuit of claim 8, wherein said element is a plurality of diodes.

17. The circuit of claim 8, wherein said element is a polysilicon resistor.

18. The circuit of claim 8 wherein said logic gate comprises a NAND gate.

19. The circuit of claim 8, wherein said logic gate comprises a NOR gate.

20. The circuit of claim 8, wherein said logic gate is an inverter.

21. A system for regulating the performance of a logic gate as a function of at least one current varying parameter, said system comprising:
   said logic gate which comprises:
      an input;
      an output; and
      a drive transistor connected to said output;
   a regulating transistor connected in series with said drive transistor between said drive transistor and a supply voltage; and
   a bias circuit sensitive to said at least one current varying parameter, said bias circuit connected to a gate of said regulating transistor.

22. The system of claim 21 wherein said at least one current varying parameter is temperature.

23. The system of claim 21 wherein said at least one current varying parameter is gate length.

24. The system of claim 21 wherein said at least one current varying parameter is threshold voltage.

25. The system of claim 21 wherein said logic gate comprises a NAND gate.

26. The system of claim 21, wherein said logic gate comprises a NOR gate.

27. The system of claim 21, wherein said logic gate is an inverter.

28. An integrated circuit comprising:
   a control circuit comprising at least one diode sensitive to a predetermined parameter, said control circuit having a control circuit output;
   a logic gate, said logic gate comprising:
      an input;
      an output;
      a first drive transistor connected between said output and a first supply voltage and having a gate connected to said input; and
      a second drive transistor connected between said output and a second supply voltage and having a gate connected to said input; and
   a regulating transistor connected in series with said first drive transistor and having a gate connected to said control circuit output.

29. An integrated circuit comprising:
   a control circuit comprising a polysilicon resistor sensitive to a predetermined parameter, said control circuit having a control circuit output;
   a logic gate, said logic gate comprising:
      an input;
      an output;
      a first drive transistor connected between said output and a first supply voltage and having a gate connected to said input; and
      a second drive transistor connected between said output and a second supply voltage and having a gate connected to said input; and
   a regulating transistor connected in series with said first drive transistor and having a gate connected to said control circuit output.

* * * * *